United States Patent
Zeng

(10) Patent No.: US 9,125,334 B2
(45) Date of Patent: Sep. 1, 2015

(54) METHOD FOR MANUFACTURING MULTILAYER PRINTED CIRCUIT BOARD

(75) Inventor: Hui Zeng, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 956 days.

(21) Appl. No.: 13/192,474

(22) Filed: Jul. 28, 2011

(65) Prior Publication Data

US 2012/0023744 A1   Feb. 2, 2012

(30) Foreign Application Priority Data

Jul. 29, 2010  (CN) .......................... 2010 1 0238873

(51) Int. Cl.
*H05K 3/00* (2006.01)
*H05K 3/36* (2006.01)
*H05K 3/20* (2006.01)
*H05K 3/10* (2006.01)
*H05K 3/02* (2006.01)
*H05K 1/00* (2006.01)
*H05K 3/46* (2006.01)

(52) U.S. Cl.
CPC ............ *H05K 3/4635* (2013.01); *H05K 3/0097* (2013.01); *H05K 2201/055* (2013.01); *H05K 2201/0715* (2013.01); *Y10T 29/49126* (2015.01)

(58) Field of Classification Search
CPC ........... H01L 2924/01079; H01L 2924/01078; H05K 13/0413; H05K 2201/0355; H05K 3/3452
USPC ............. 29/829, 830, 831, 846, 847; 174/250
See application file for complete search history.

(56) References Cited

U.S. PATENT DOCUMENTS

| | | | | |
|---|---|---|---|---|
| 5,144,742 | A | * | 9/1992 | Lucas et al. ..................... 29/830 |
| 5,262,594 | A | * | 11/1993 | Edwin et al. ................... 174/254 |
| 5,499,444 | A | * | 3/1996 | Doane et al. .................... 29/830 |
| 5,795,162 | A | * | 8/1998 | Lambert ......................... 439/63 |
| 6,514,793 | B2 | * | 2/2003 | Isaak ............................ 438/109 |
| 7,663,064 | B2 | * | 2/2010 | Dutta et al. .................... 174/261 |
| 2014/0182900 | A1 | * | 7/2014 | Hou ............................... 174/254 |
| 2014/0216792 | A1 | * | 8/2014 | Sebanz et al. ................. 174/254 |

FOREIGN PATENT DOCUMENTS

TW    M263719    *  5/2005
TW    M263719 U     5/2005

OTHER PUBLICATIONS

Rong-Sheng Bai; Print Circuit Board Term Manual (2009);date: Nov. 2009;pp. 407-408;Taiwan Printed Circuit Association;Taiwan.

* cited by examiner

*Primary Examiner* — David Angwin
(74) *Attorney, Agent, or Firm* — Novak Druce Connolly Bove + Quigg LLP

(57) ABSTRACT

In a method for manufacturing multilayer PCBs having n circuit layers, a double-sided flexible substrate strip is provided. The strip comprises a number of PCB units, each comprising m segments, wherein m=n/2 if n represents an even integer, and m=(n+1)/2 if n represents an odd integer. Each segment includes two foil portions. In a reel to reel process, the strip is treated to form n−2 foil portions of each PCB unit into traces, further remove one foil portion if n represents an odd integer. The other two foil portions are left untreated. Then the strip is cut to separate the PCB units from each other. The PCB unit is folded in such a manner that the traces are arranged between the other two foil portions. The folded PCB unit is laminated to form a multilayer substrate and traces are formed in the two foil portions.

18 Claims, 29 Drawing Sheets

Providing a double-sided flexible substrate strip, the flexible substrate strip including a plurality of PCB units, each PCB unit comprising n/2 segmental portions connected along a length of the PCB unit, each segmental portion including two copper foil portions Forming n-2 copper foil portions of the n/2 segmental portions of each PCB unit into traces with remaining two copper foil portions of each PCB unit left untreated, in a reel to reel process Cutting the flexible substrate strip into pieces along border lines between the PCB units to separate the PCB units from each other Folding each PCB unit along border lines between the n/2 segmental portions in such a manner that the n-2 copper foil portions having traces are folded and sandwiched between the remaining untreated two copper foil portions Laminating each folded PCB unit to form a plurality of laminated multilayer substrates Forming traces in the remaining untreated two copper foil portions

FIG. 1

Providing a double-sided flexible substrate strip, the strip including a plurality of PCB units, each PCB unit comprising $(n+1)/2$ segmental portions connected along a length of the PCB unit, each segmental portion including two copper foil portions Treating the $(n+1)/2$ segmental portions of each PCB unit to remove one copper foil portion and to form $n-2$ copper foil portions into traces with remaining two copper foil portions of each PCB unit left untreated, in a reel to reel process Cutting the flexible substrate strip into pieces along border lines between the PCB units to separate the PCB units from each other Folding each PCB unit along border lines between the $(n+1)/2$ segmental portions in such a manner that the $n-2$ copper foil portions having traces are folded and sandwiched between the remaining untreated two copper foil portions Laminating each folded PCB unit to form a plurality of laminated multilayer substrates Forming traces in the remaining untreated two copper foil portions

FIG. 2

METHOD FOR MANUFACTURING MULTILAYER PRINTED CIRCUIT BOARD

CROSS-REFERENCE TO RELATED APPLICATION

This application is related to a commonly-assigned co-pending application application Ser. No. 13/181,453 entitled, "METHOD FOR MANUFACTURING MULTILAYER PRINTED CIRCUIT BOARD", filed on 12 Jul. 2011. Disclosures of the above identified application are incorporated herein by reference.

BACKGROUND

1. Technical Field

The present disclosure generally relates to technology of manufacturing printed circuit boards (PCBs), and particularly, to a method for manufacturing a number of multilayer PCBs.

2. Description of Related Art

Multilayer PCBs are widely used in various electronic devices such as mobile phones, printers, and hard disk drives. Multilayer PCBs are manufactured by panel process and build-up process. For example, a six-layer PCB would be manufactured by the following steps. Firstly, a double-sided substrate having traces is provided. Then two single-sided substrates are attached to two opposite sides of the double-sided substrate, respectively, to form a four-layer substrate. After the two single-sided substrates are etched to form traces, another two single-sided substrates are attached to two opposite sides of the four-layer substrate, respectively, to form a six-layer substrate. Then the two single-sided substrates are etched to form traces. However, during the above, several etching steps are required to form traces in the different layers. That is, a long time is needed to manufacture the multilayer PCB, and accuracy may be lacking in the traces formed this way.

What is needed, therefore, is a method for manufacturing multilayer PCBs that overcomes the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

FIG. 1 is a flowchart of a process for manufacturing multilayer flexible PCBs in accordance with an exemplary embodiment, wherein each PCB comprises n circuit layers, n representing an even integer greater than 2.

FIG. 2 is a flowchart of a process for manufacturing multilayer flexible PCBs in accordance with another exemplary embodiment, wherein each PCB comprises n circuit layers, n representing an odd integer greater than 2.

DETAILED DESCRIPTION

Embodiments will now be described in detail below and with reference to the drawings.

Referring to FIG. 1, described below is a method for manufacturing multilayer flexible PCBs, wherein each comprises n circuit layers, n representing an even integer greater than 2, and the method includes the steps of:

(1) providing a flexible substrate strip wound around two spools, the flexible substrate strip comprising two copper foils and an insulating layer sandwiched between the two copper foils, the flexible substrate strip including a plurality of PCB units arranged along a length of the flexible substrate strip, each PCB unit comprising n/2 segments connected along a length of the PCB unit, each segment including two foil portions;

(2) forming n−2 foil portions of each PCB unit into traces with remaining two foil portions of each PCB unit left untreated, in a reel to reel process;
(3) cutting the flexible substrate strip into pieces along border lines between the PCB units to separate the PCB units from each other;
(4) folding each PCB unit along border lines between the n/2 segments in such a manner that the traces formed from the n−2 foil portions are folded and sandwiched between the remaining untreated two foil portions;
(5) laminating each folded PCB unit to form a plurality of laminated multilayer substrates; and
(6) forming traces in the remaining untreated two foil portions.

Referring to FIG. 2, another method for manufacturing multilayer flexible PCBs is also described below, each of the flexible PCBs comprising n circuit layers, n representing an odd integer greater than 2, the method comprising:
(1) providing a flexible substrate strip wound around two spools, the flexible substrate strip comprising two copper foils and an insulating layer sandwiched between the two copper foils, the flexible substrate strip including a plurality of PCB units arranged along a length of the flexible substrate strip, each PCB unit comprising (n+1)/2 segments connected along a length of the PCB unit, each segment including two foil portions;
(2) treating each PCB unit to remove one foil portion and to form n−2 foil portions into traces with remaining two foil portions of each PCB unit left untreated, in a reel to reel process;
(3) cutting the flexible substrate strip into pieces along border lines between the PCB units to separate the PCB units from each other;
(4) folding each PCB unit along border lines between the (n+1)/2 segments in such a manner that the traces formed from the n−2 foil portions are folded and sandwiched between the remaining untreated two foil portions;
(5) laminating each folded PCB unit to form a plurality of laminated multilayer substrates; and
(6) forming traces in the remaining untreated two foil portions.

Referring to FIGS. 2-11, a method for manufacturing three-layer flexible PCBs provided in a first embodiment includes the following steps.

Figure 3:
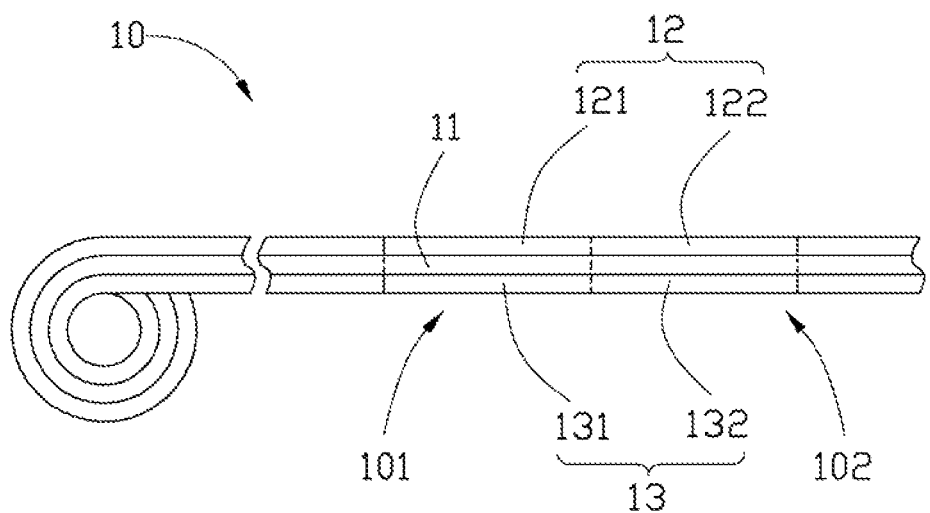
FIG. 3 is a sectional view of a double-sided flexible substrate strip provided in a first embodiment.
Figure 4:
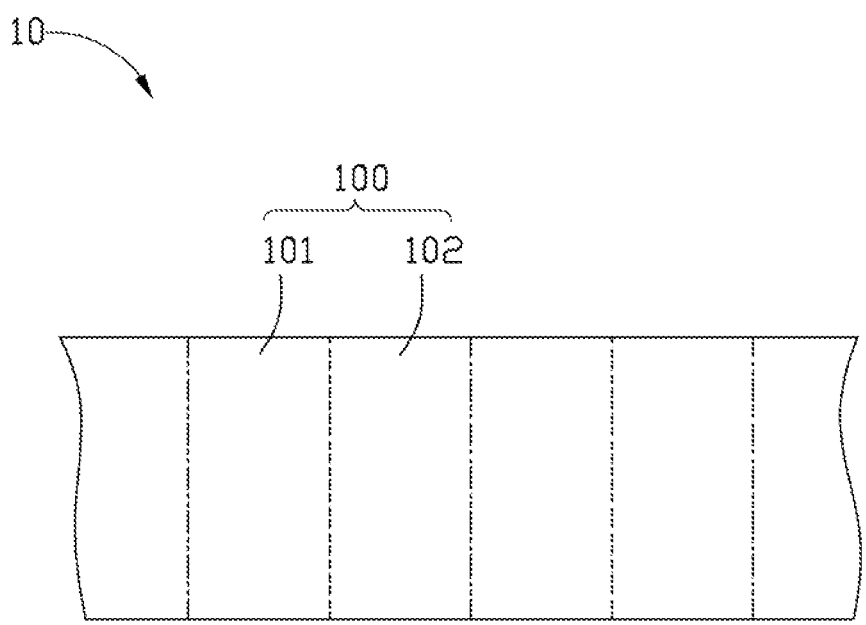
FIG. 4 is a top view of the strip of FIG. 3, wherein the flexible substrate strip includes a number of PCB units, the PCB units each include two segments, each segment includes two foil portions.
Figure 5:
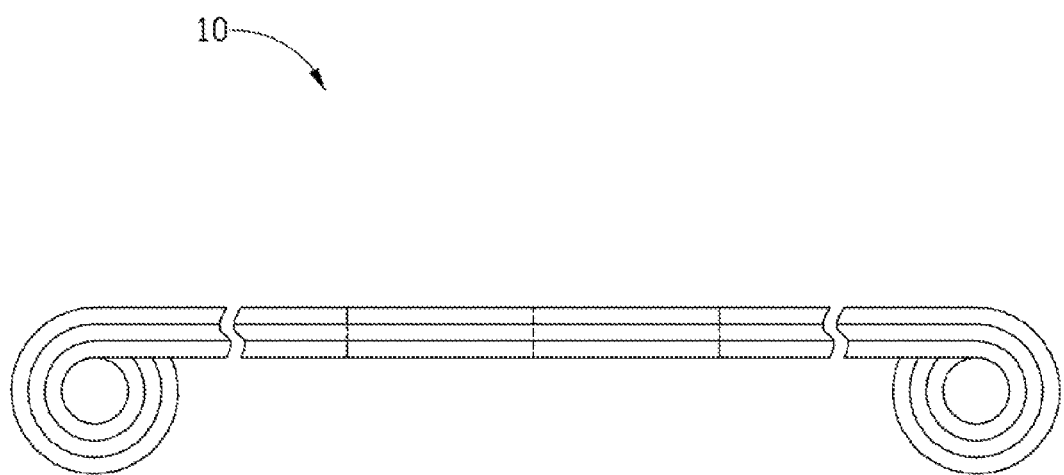
FIG. 5 is a schematic view of treating the strip of FIG. 3 in a reel to reel process.

Referring to FIGS. 3-5, in step (1), a double-sided flexible substrate strip 10 wound around two spools is provided. The strip 10 includes an upper copper foil 12, a bottom copper foil 13, and an insulation layer 11 sandwiched and in contact with the upper and bottom copper foils 12 and 13. The insulation layer 11 is comprised of flexible material, such as polyimide, polyethylene terephthalate, and polyethylene naphthalate. The strip 10 includes a number of PCB units 100 connected sequentially along a lengthwise direction of the strip 10. Border lines between the PCB units 100 are substantially parallel to each other and substantially perpendicular to a length of the strip 10.

Each of the PCB units 100 can be formed into a three-layer PCB. In the illustrated embodiment, the PCB units 100 each include a first segment 101 and a second segment 102 connected along the lengthwise direction of the strip 10. The segments 101 and 102 are the same size. Border lines between the segments 101 and 102 are also substantially parallel to each other and substantially perpendicular to the length of the strip 10.

Each segment includes a portion of the insulation layer 11, a portion of the upper copper foil 12, and a portion of the bottom copper foil 13. In the illustrated embodiment, the first segment 101 includes a first foil portion 121 and a second foil portion 131, the second segment 102 includes a third foil portion 122 and a fourth foil portion 132. The first and third foil portions 121 and 122 of each of the PCB units 100 connect with each other to form the upper copper foil 12. The second and fourth foil portions 131 and 132 of each of the PCB units 100 connect with each other to form the bottom copper foil 13.

Figure 6:
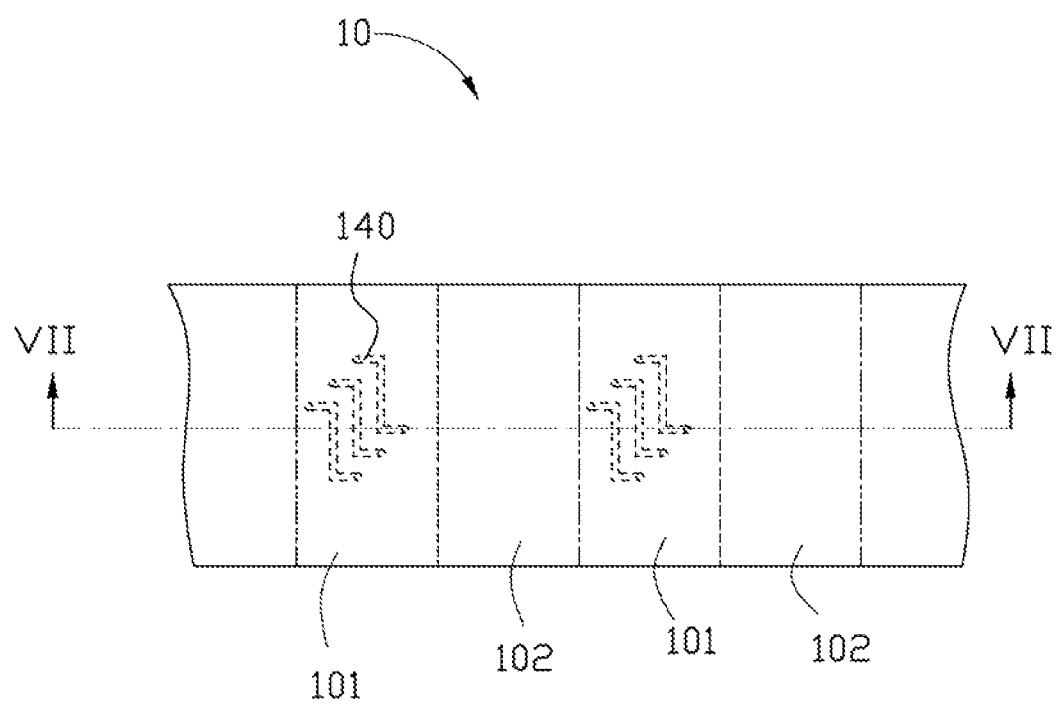
FIG. 6 is similar to FIG. 4, but shows one foil portion of each PCB unit formed into traces.
Figure 7:
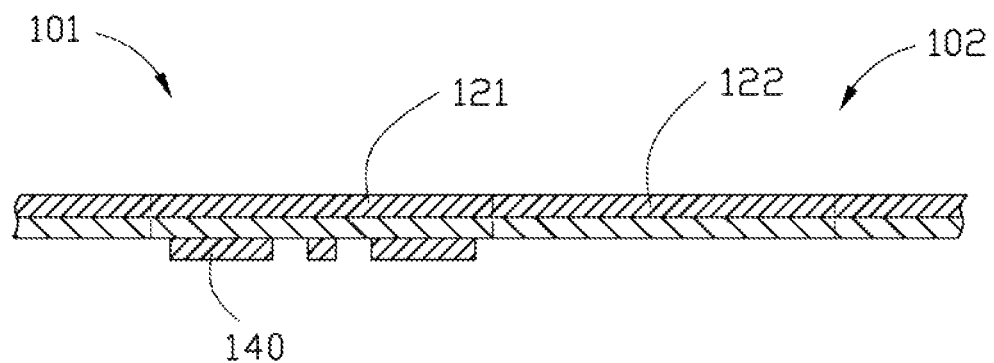
FIG. 7 is a sectional view of the strip taken along line VII-VII of FIG. 6.

Referring to FIGS. 5 to 7, in step (2), the strip 10 is treated to form the second foil portion 131 into traces 140 and remove the fourth foil portion 132 with remaining the first and third foil portions 121 and 122 left untreated, in a reel to reel process.

Treating the strip 10 includes the following steps. First, the strip 10 is unwound from one spool. Then the unwound portion of the strip 10 located between the spools is treated such that the bottom copper layer 13 of each of the PCB unit 100 is etched to remove the fourth foil portions 132 and form the second foil portions 131 into the traces 140. The strip 10 can be etched using a chemical solution or laser beam, as is well known in the art. And finally the treated unwound portion is fed and wound onto the other spool.

Figure 8:
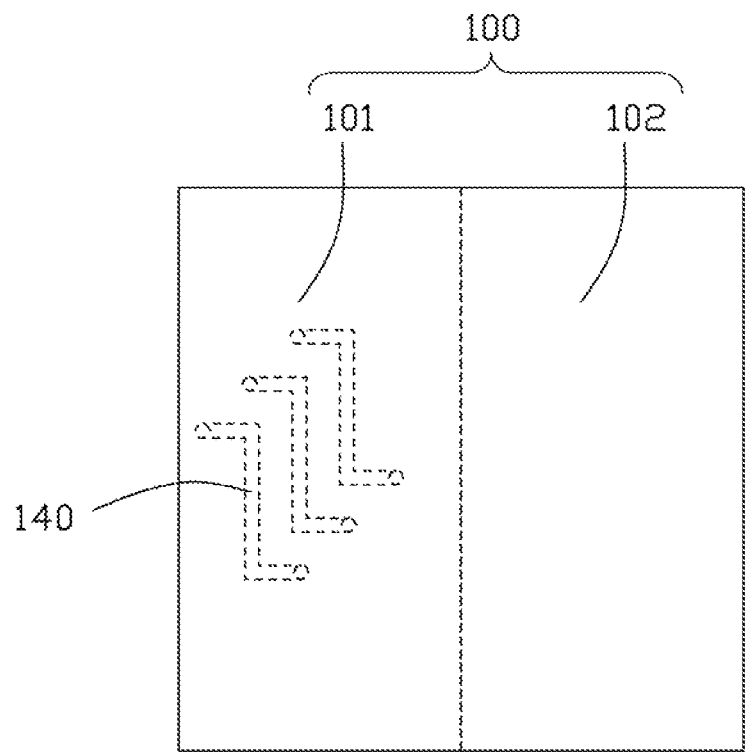
FIG. 8 is similar to FIG. 6, but shows the strip divided into a number of separate PCB units.

Referring to FIG. 8, in step (3), the strip 10 is cut along border lines between the PCB units 100, to separate the PCB units 100 from each other. In the illustrated embodiment, the strip 10 is cut along border lines between each two adjacent PCB units 100.

Figure 9:
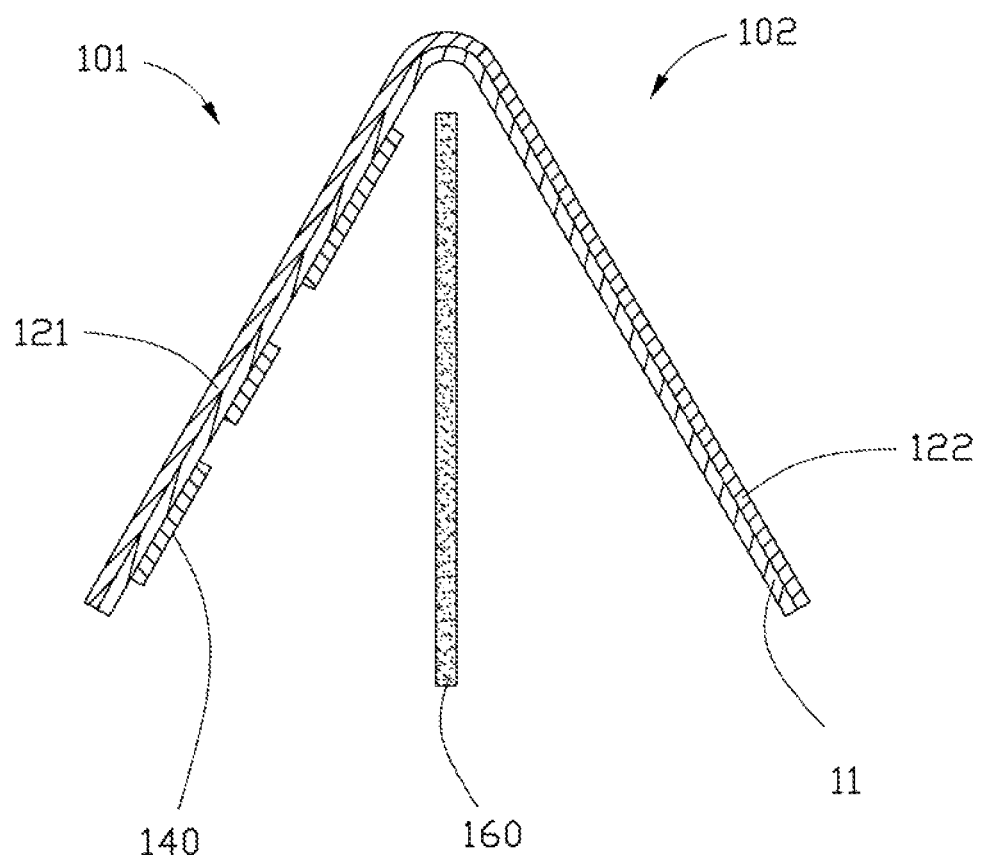
FIG. 9 is a schematic view of folding the PCB unit of FIG. 8.

Referring to FIG. 9, in step (4), each of the separate PCB units 100 is folded along a border line between the first and second segment 101 and 102. Specifically, the insulation layer 11 of the second segment 102 is adjacent to the traces 140 of the first segment 101. Due to the flexibility of the insulation layer 11, the PCB unit 100 can be folded in such a manner that the segments 101 and 102 are substantially parallel to each other.

Figure 10:
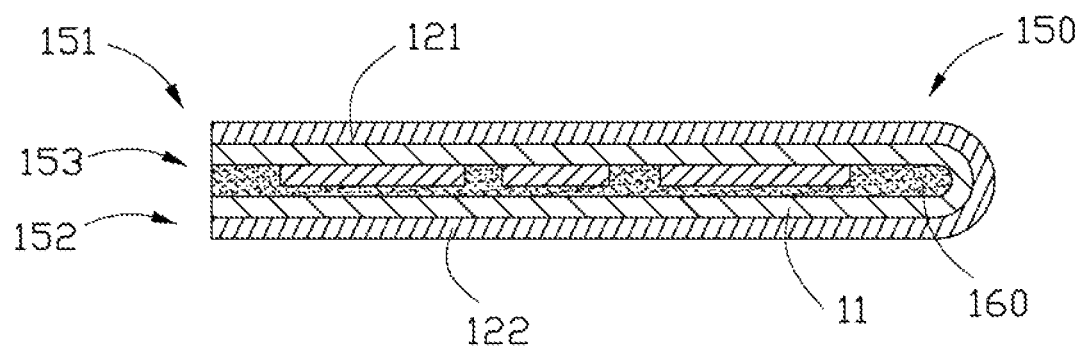
FIG. 10 is a schematic view of laminating the folded PCB unit of FIG. 9.

Referring to FIGS. 9 and 10, in step (5), an adhesive sheet 160 is provided and laminated between the two segments 101 and 102 to form a three-layer substrate 150. In detail, the adhesive sheet 160 is disposed between the insulation layer 11 of the second segment 102 and the traces 140 of the first segment 101. Then the folded PCB unit 100 and the adhesive sheet 160 are laminated together to form a three-layer substrate 150. During the laminating process, the adhesive sheet 160 reacts to the heat, and then flows to fill the gaps between the traces 140 and binds the segments 101 and 102 together.

The three-layer substrate 150 includes a first outer substrate 151, a second outer substrate 152, and an inner substrate 153 laminated sandwiched between the first and second outer substrates 151 and 152. The first outer substrate 151 consists of the insulation layer 11 of the first segment 101 and the first foil portion 121, the second outer substrate 152 consists of the insulation layer 11 of the second segment 102 and the third foil portion 122, and the inner substrate 153 consists of the adhesive sheet 160 and the traces 140 formed from the second foil portion 131. That is, the first outer substrate 151, the second outer substrate 152, and the inner substrate 153 each are single-layer substrates. The traces 140 formed from the second foil portion 131 constitute a circuit layer of the three-layer substrate 150. The first and third foil portions 121 and 122 are exposed to the exterior.

Figure 11:
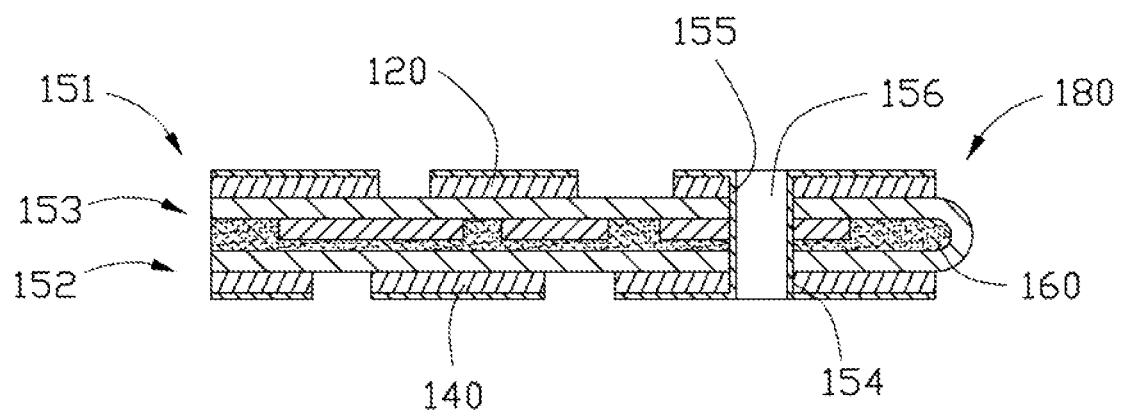
FIG. 11 is a schematic view of a three-layer PCB.

Referring to FIG. 11, in step (6), the three-layer substrate 150 is manufactured to be a three-layer PCB 180. Both of the first and third foil portions 121 and 122 are formed into traces 140, in a panel process. The traces 140 of each of the substrates 151 through 153 form one circuit layer of the three-layer PCB 180.

In the illustrated embodiment, the method of manufacturing the three-layer PCB 180 from the three-layer substrate 150 includes the following steps. First, a through hole 154 is formed in the three-layer substrate 150. Then the three-layer substrate 150 is processed using an electroless plating technology and electroplating technology to form a coating 155 on the sidewall of the through hole 154, on the surface of the first foil portion 121, and on the surface of the third foil portion 122. Thus, a plated through hole 156 is obtained to electrically connect the traces 140 of the inner substrate 153, the first foil portion 121 of the first outer substrate 151, and the third foil portion 122 of the second outer substrate 152 together. Finally, the first and third foil portions 121 and 122 each are etched to form into traces 140. The traces 140 formed from the first foil portion 121 define one circuit layer of the three-layer PCB 180. The traces 140 formed from the third foil portion 122 define another circuit layer of the three-layer PCB. The traces 140 formed from the second foil portion 131 define another three-layer PCB. The three circuit layers are electrically connected with the plated through hole 156.

In the above-mentioned steps, it is understood that three foil portions of each of the PCB units 100 are processed to form three circuit layers of the three-layer PCB 180, and the other one foil portion of each of the PCB units 100 is removed.

In addition, coverlays can be covered on the traces 140 of the first and second outer substrates 151 and 152 to protect the traces 140.

Referring to FIGS. 1 and 12-16, a method for manufacturing four-layer flexible PCBs provided in a second embodiment includes the following steps.

Figure 12:
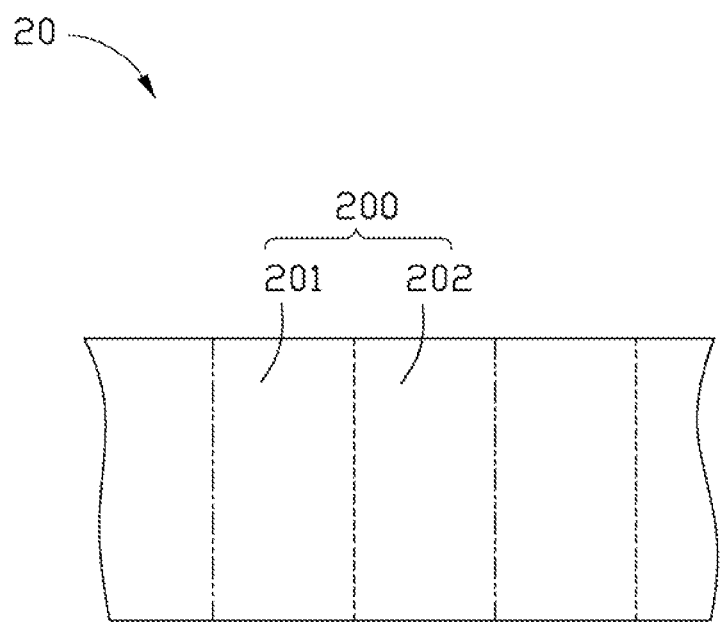
FIG. 12 is a top view of a double-sided flexible substrate strip provided in a second embodiment, wherein the strip includes a number of PCB units, each PCB unit includes two segments, each segment includes two foil portions.
Figure 13:
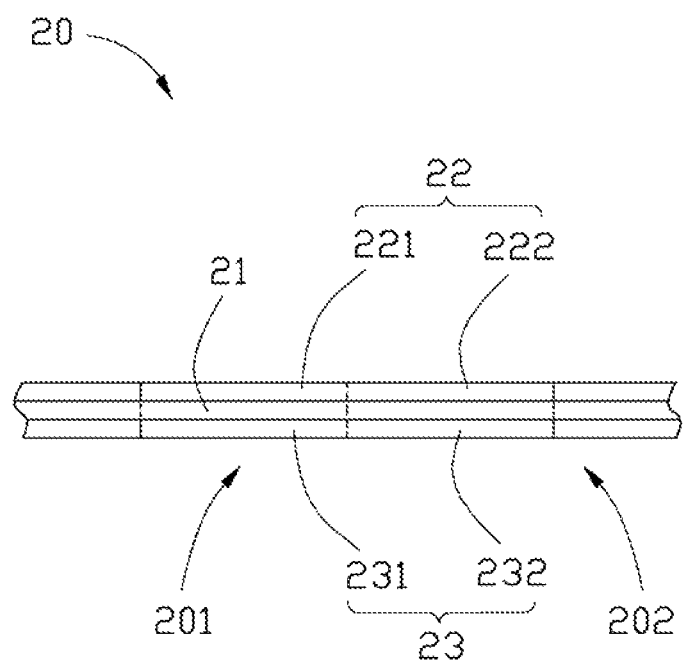
FIG. 13 is a sectional view of the strip of FIG. 12.

Referring to FIGS. 12 and 13, in step (1), a flexible substrate strip 20 is provided. The strip 20 is similar to the strip 10 of the first embodiment, and includes an insulation layer 21, an upper copper foil 22, and a bottom copper foil 23, wherein the upper and bottom copper foils 22 and 23 are attached on two opposite sides of the insulation layer 21. The strip 20 includes a number of PCB units 200 connected sequentially along a lengthwise direction of the strip 20. Each of the PCB units 200 can be formed into a four-layer PCB. The PCB units 200 each include a first segment 201 and a second segment 202 connected along a length of the PCB unit.

Each segment includes a portion of the insulation layer 21, a portion of the upper copper foil 22, and a portion of the bottom copper foil 23. In the illustrated embodiment, the first segment 201 includes a first foil portion 221 and a second foil portion 231, the second segment 202 includes a third foil portion 222 and a fourth foil portion 232. The first and third foil portions 221 and 222 are portions of the upper copper foil 22. The second and fourth foil portions 231 and 232 are portions of the bottom copper foil 23.

Figure 14:
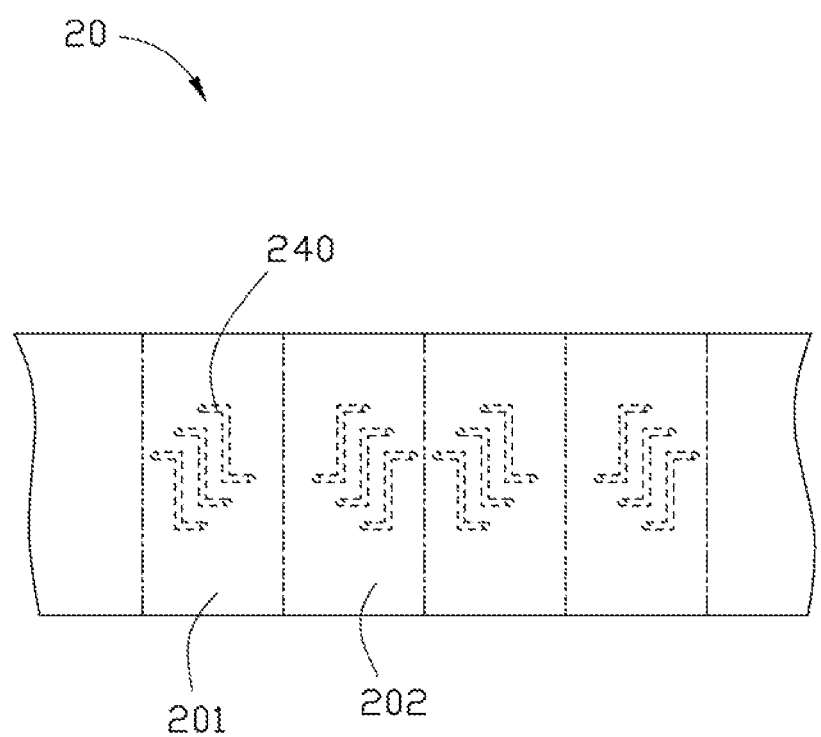
FIG. 14 is similar to FIG. 12, but shows two foil portions of the strip formed into traces.
Figure 15:
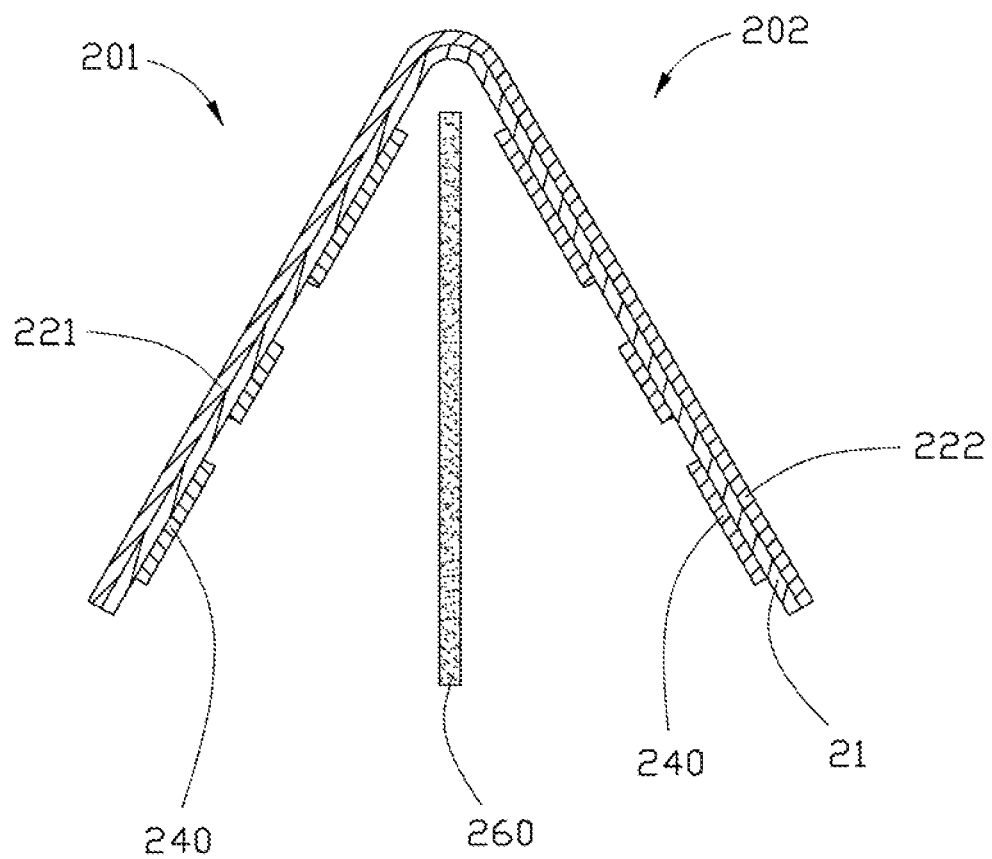
FIG. 15 is a schematic view of folding one PCB unit separated from the strip of FIG. 14.

Referring to FIGS. 14 and 15, in step (2), the strip 20 is treated to form the second and fourth foil portions 231 and 232 into traces 240, in a reel to reel process. The first and third segments 221 and 222 are left untreated without traces 240. The traces 240 can be obtained by etching the second and fourth copper foils 231 and 232 of the bottom copper layer 23 of the strip 20.

Referring to FIG. 15, in step (3), the strip 20 is cut along border lines between the PCB units 200 to separate the PCB units 100 from each other.

Referring to FIG. 15, in step (4), each of the separate PCB units 200 is folded along a border line between the first and second segments 201 and 202 in such a manner that the traces 240 of the first segment 201 are adjacent to the traces 240 of the second segment 202. Due to the flexibility of the insulation layer 21, the PCB unit 200 can be folded in such a manner that the segments 201 and 202 are substantially parallel to each other.

Figure 16:
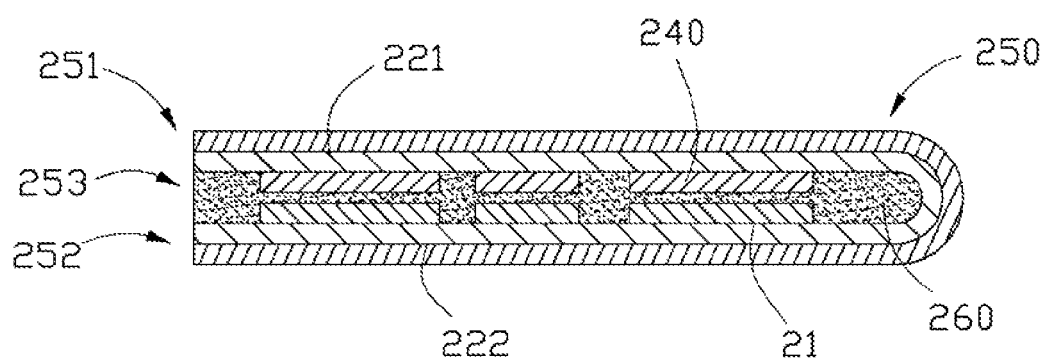
FIG. 16 is a schematic view of laminating the folded PCB unit of FIG. 15.

Referring to FIGS. 15 and 16, in step (5), an adhesive sheet 260 is disposed between the traces 240 of the first segment 201 and the traces 240 of the second segment 202, then the folded PCB unit 200 and the adhesive sheet 260 are laminated together to form a four-layer substrate 250. During the laminating process, the adhesive sheet 260 flows to fill the gaps between the traces 240 and binds the segments 201 and 202.

The four-layer substrate 250 includes a first outer substrate 251, a second outer substrate 252, and an inner substrate 253 sandwiched between the first and second outer substrates 251 and 252. The first outer substrate 251 consists of the insulation layer 21 of the first segment 201 and the first foil portion 221. The second outer substrate 252 consists of the insulation layer 21 of the second segment 202 and the third foil portion 222. The inner substrate 253 consists of the adhesive sheet 260, the traces 240 formed from the second foil portion 231, and the traces 240 formed from the fourth foil portion 232. That is, both of the first and second outer substrates 251 and 252 are single-layer substrates, and the inner substrate 253 is a double-layer substrate. In particular, the first and third foil portions 221 and 222 are exposed to the exterior.

Figure 17:
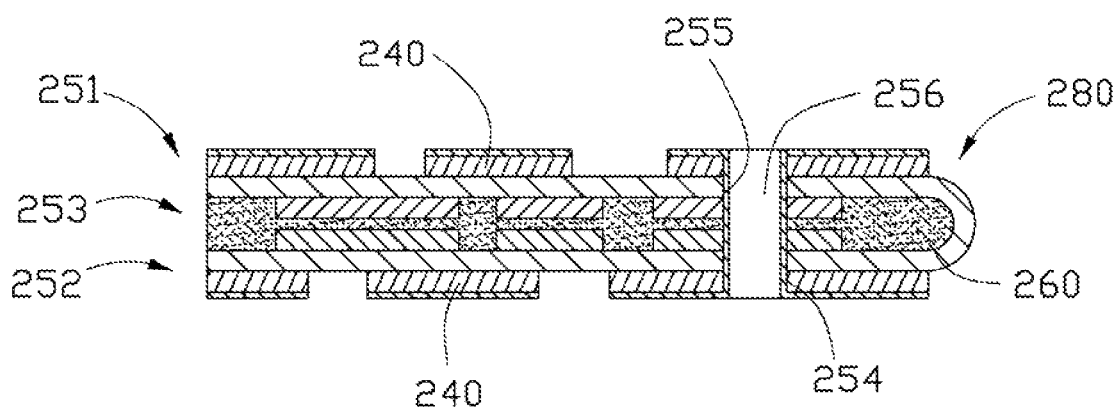
FIG. 17 is a schematic view of an obtained four-layer PCB.

Referring to FIGS. 16 and 17, in step (6), the four-layer substrate 250 is manufactured to be a four-layer PCB 280. Both of the first and third foil portions 221 and 222 are formed into traces 240, in a panel process. The traces 240 of the substrates 251 through 253 can be electrically connected with each other by via holes.

In the illustrated embodiment, the method of manufacturing the four-layer PCB 280 from the four-layer substrate 250 includes the following steps. First, a through hole 254 is formed in the four-layer substrate 250. Then the four-layer substrate 250 is processed using an electroless plating technology and electroplating technology to form a coating 255 on the sidewall of the through hole 254, on the surface of the first foil portion 221, and on the surface of the third foil portion 222. Thus, a plated through hole 256 is obtained to electrically connect the traces 240 of the inner substrate 253, the first foil portion 221 of the first outer substrate 251, and the third foil portion 222 of the second outer substrate 252 together. Finally, the first and third foil portions 221 and 222 each are formed into traces 240 by etching process. The traces 240 of the first outer substrate 251 define one circuit layer of the four-layer PCB 280. The traces 240 of the second outer substrate 252 also define one circuit layer of the four-layer PCB 280.

In the above-mentioned steps, it is understood that each of the four foil portions of the PCB unit 200 is processed to form one circuit layer of the four-layer PCB 280, and the circuit layers of the four-layer PCB 280 are electrically connected with each other by the plated through hole 256.

Referring to FIGS. 2 and 18-23, a method for manufacturing five-layer flexible PCBs provided in a third embodiment includes the following steps.

Figure 18:
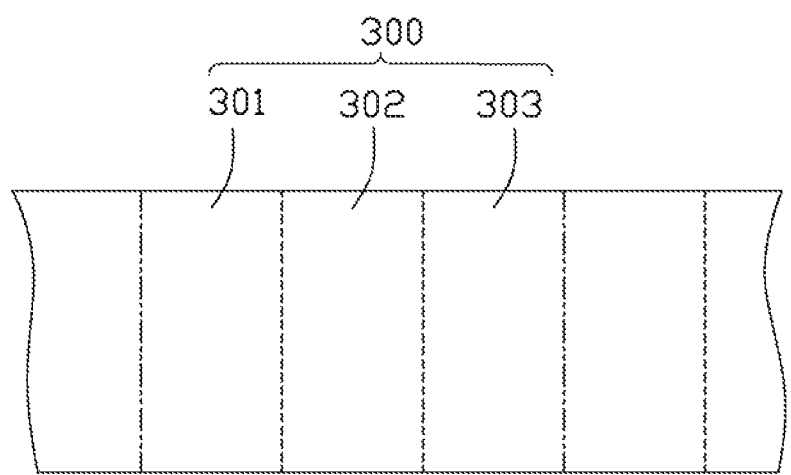
FIG. 18 is a top view of a double-sided flexible substrate strip provided in a third embodiment, wherein the strip includes a number of PCB units, each PCB unit includes three segments, each segment includes two foil portions.
Figure 19:
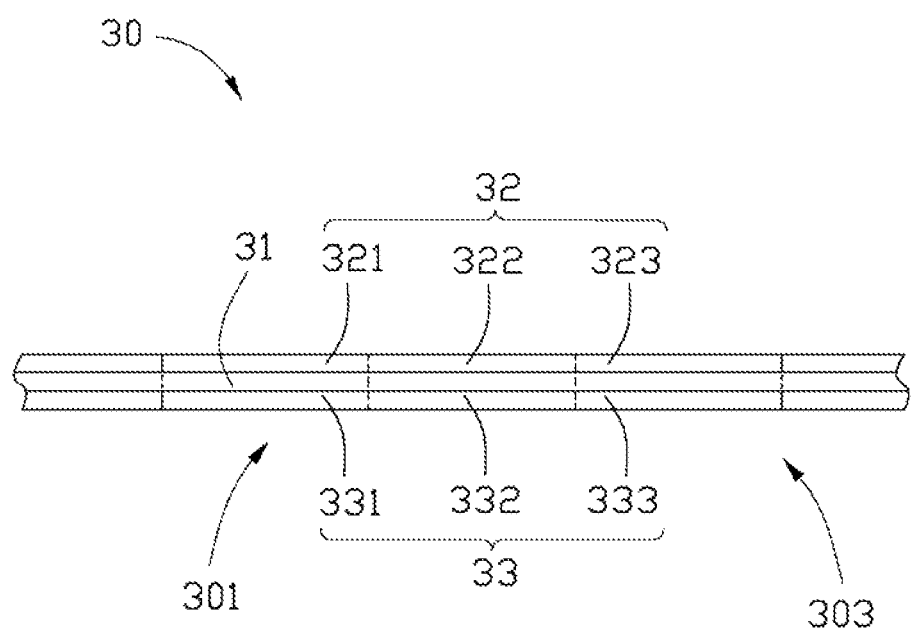
FIG. 19 is a sectional view of the strip of FIG. 18.

Referring to FIGS. 18 and 19, in step (1), a double-sided flexible substrate strip 30 is provided. The strip 30 is similar to the strip 10 of the first embodiment, and includes an insulation layer 31, an upper copper foil 32, and a bottom copper foil 33. The strip 30 includes a number of PCB units 300 connected sequentially along a length of the strip 30. Border lines between the PCB units 300 are substantially parallel to each other and substantially perpendicular to a length of the strip 30. Each of the PCB units 300 can be formed into a five-layer PCB. In the illustrated embodiment, the PCB units 300 each include a first segment 301, a second segment 302, and a third segment 303 connected sequentially along the length of the strip 30, wherein the second segment 302 interconnects the first and third segments 301 and 303. The segments 301 through 303 are the same size. Border lines between each two adjacent segments are also substantially parallel to each other and substantially perpendicular to a length of the strip 30.

Each segment includes a portion of the insulation layer 31, a portion of the upper copper foil 32, and a portion of the bottom copper foil 33. In the illustrated embodiment, the first segment 301 includes a first foil portion 321 and a second foil portion 331, the second segment 302 includes a third foil portion 322 and a fourth foil portion 332, and the third segment 303 includes a fifth foil portion 323 and a sixth foil portion 333. The first, third, and fifth foil portions 321, 322, and 323 are portions of the upper copper foil 32. The second, fourth, and sixth foil portions 331, 332, and 333 are portions of the bottom copper foil 33.

Figure 20:
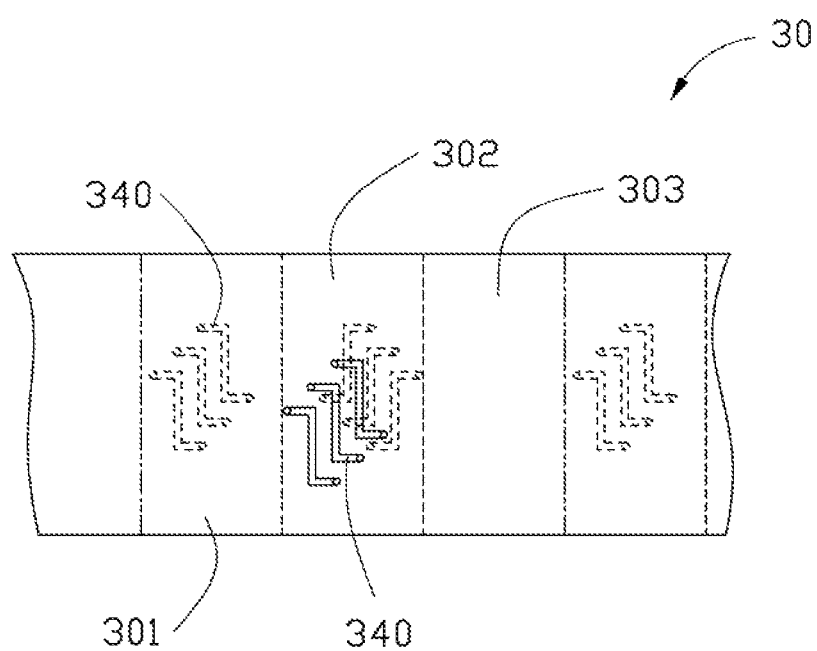
FIG. 20 is similar to FIG. 18, but shows four foil portions of the strip formed into traces.
Figure 21:
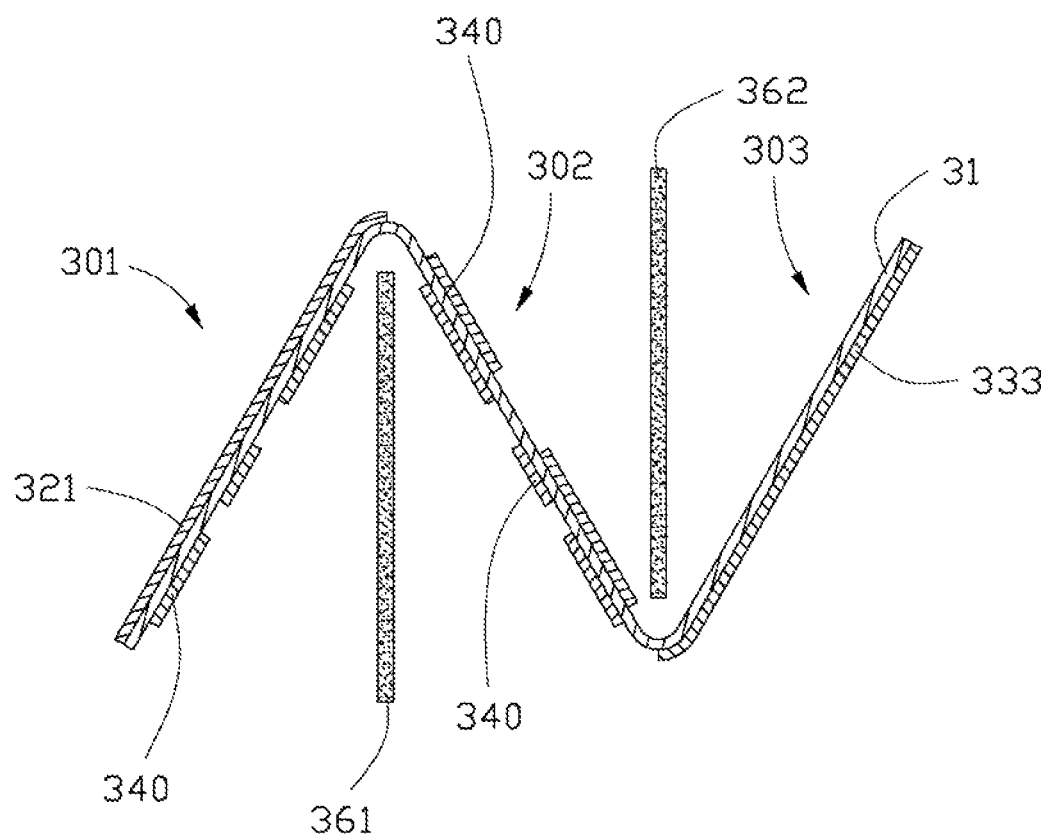
FIG. 21 is a schematic view of folding one PCB unit separated from the strip of FIG. 20.

Referring to FIGS. 20 and 21, in step (2), the strip 30 is treated to form the second, third, and fourth foil portions 331, 322, and 332 into traces 340 and remove the fifth foil portion 323, in a reel to reel process. The first and sixth foil portions 321 and 333 remain untreated. The strip 30 can be treated in an etching process, using a chemical solution or laser beam to form the traces 340 and remove the fifth foil portion 323, as is well known in the art.

Referring to FIG. 21, in step (3), the strip 30 is cut along border lines between the PCB units 300 to separate PCB units 300 from each other.

Referring to FIG. 21, in step (4), each of the separate PCB units 300 is folded along border lines between each two adjacent segments in such a manner that the second segment 302 is disposed between the first and third segments 301 and 303. In particular, the traces 340 formed from the second foil portion 331 are adjacent to the traces 340 formed from the fourth foil portion 332, and the traces 340 formed from the third foil portion 322 are adjacent to the insulation layer 31 of the third segment 303.

Figure 22:
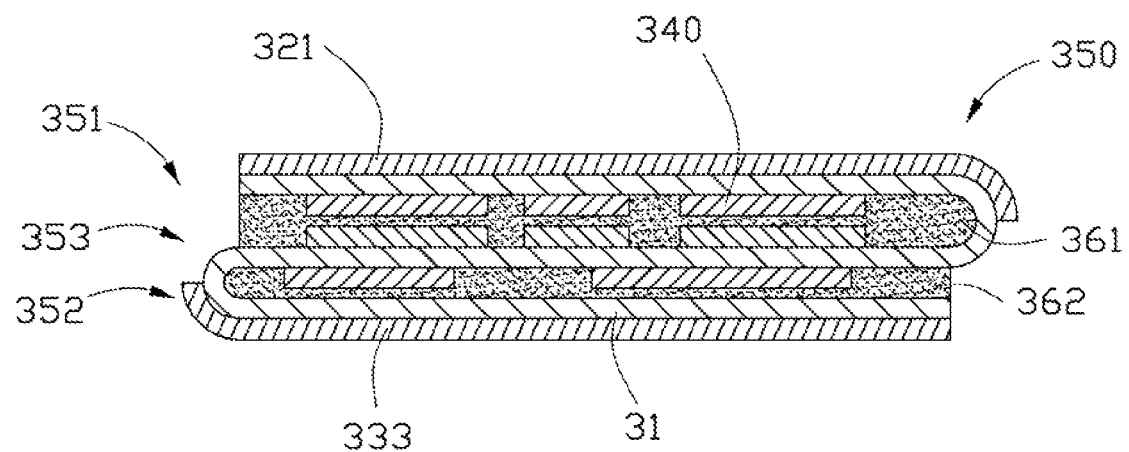
FIG. 22 is a schematic view of laminating the folded PCB unit of FIG. 21.

Referring to FIGS. 21 and 22, in step (5), two adhesive sheets are provided and each laminated between two adjacent segments to form a five-layer substrate 350.

In detail, a first adhesive sheet 361 is disposed between the first segment 301 and the second segment 302, and a second adhesive sheet 362 is disposed between the second segment 302 and the third segment 303. Then the folded PCB unit 300 and the adhesive sheets 361 and 362 are laminated together to form the five-layer substrate 350. During the laminating process, the adhesive sheets 361 and 362 flow to fill the gaps between the traces 340 and bind the segments 301 through 303.

The five-layer substrate 350 includes a first outer substrate 351, a second outer substrate 352, and an inner substrate 353 sandwiched between the first and second outer substrates 351 and 352. The first outer substrate 351 consists of the insulation layer 31 of the first segment 301 and the first foil portion 321. The second outer substrate 352 consists of the insulation layer 31 of the third segment 303 and the sixth foil portion 333. The inner substrate 353 consists of the traces 340 formed from the second foil portion 331, the first adhesive sheet 361, the traces 340 formed from the fourth foil portion 332, the insulation layer 31 of the second segment 302, the traces 340 formed from the third foil portion 322, and the second adhesive sheet 362. That is, both of the first and second outer substrates 351 and 352 are single-layer substrates, and the inner substrate 353 is a three-layer substrate. The first and sixth foil portions 321 and 333 are exposed to the exterior.

Figure 23:
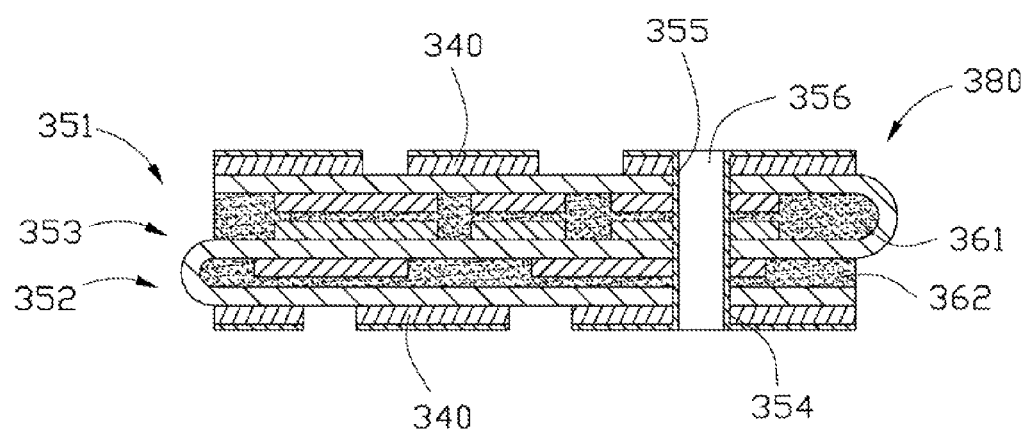
FIG. 23 is a schematic view of an obtained five-layer PCB.

Referring to FIGS. 22 and 23, in step (6), the five-layer substrate 350 is manufactured to be a five-layer PCB 380. Both of the first and sixth foil portions 321 and 333 are formed into traces 340 in a panel process. The traces 340 of the substrates 351 through 353 can be electrically connected with each other by via holes.

In the illustrated embodiment, the method of manufacturing the five-layer PCB 380 from the five-layer substrate 350 includes the following steps. First, a through hole 354 is formed in the five-layer substrate 350. Then the five-layer substrate 350 is processed using an electroless plating technology and electroplating technology to form a coating 355 on the sidewall of the through hole 354, on the surface of the first foil portion 321, and on the surface of the sixth foil portion 333. Thus, a plated through hole 356 is obtained to electrically connect the traces 340 of the inner substrate 353, the first foil portion 321, and the sixth foil portion 333. Finally, the first and sixth foil portions 321 and 333 are etched to form into traces 340. The traces 340 formed from the first foil portion 321 define one circuit layer of five-layer PCB 380. The traces 340 formed from the sixth foil portions 333 also define one circuit layer of five-layer PCB 380.

In the above-mentioned steps, it is understood that five foil portions of each of the PCB units 300 are processed to form five circuit layers of the five-layer PCB 380, and the other one foil portion of each of the PCB units 300 is removed.

Referring to FIGS. 1 and 24-29, a method for manufacturing eight-layer flexible PCBs provided in a fourth embodiment includes the following steps.

Figure 24:
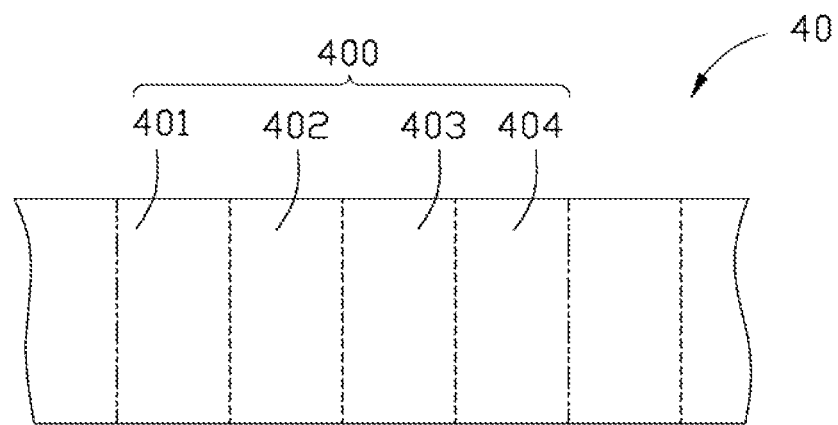
FIG. 24 is a top view of a double-sided flexible substrate strip provided in a third embodiment, wherein the strip includes a number of PCB units, each PCB unit includes four segments, and each segment includes two foil portions.
Figure 25:
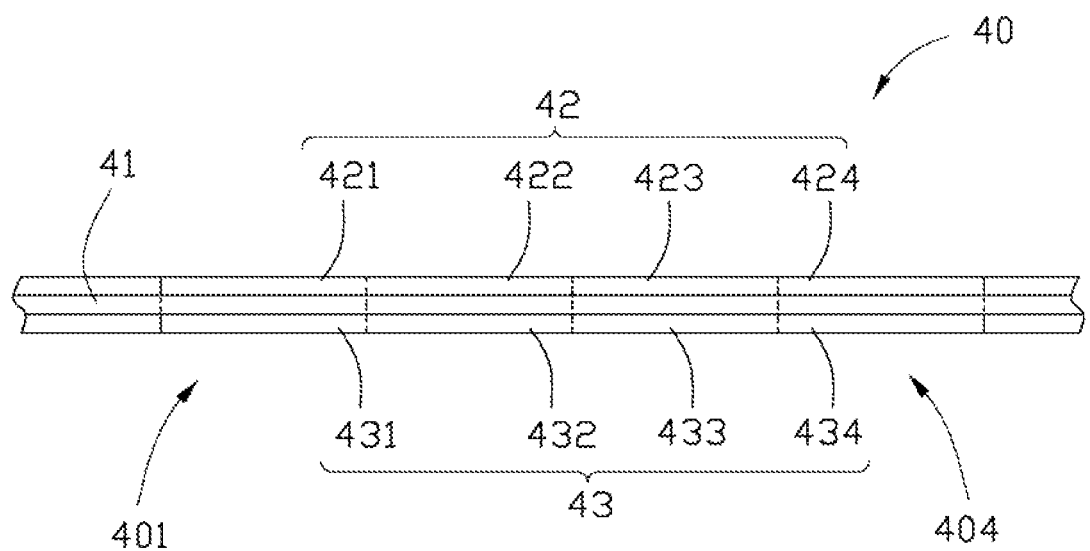
FIG. 25 is a sectional view of the strip of FIG. 24.

Referring to FIGS. 24 and 25, in step (1), a double-sided flexible substrate strip 40 is provided. The strip 40 is similar to the strip 10 of the first embodiment, and includes an insulation layer 41, an upper copper foil 42, and a bottom copper foil 43. The strip 40 includes a number of PCB units 400 connected sequentially along a length of the strip 40. Each of the PCB units 400 can be formed into an eight-layer PCB, and includes a first segment 401, a second segment 402, a third segment 403, and a fourth segment 404 connected sequentially along a length of the strip 40, wherein the second segment 402 interconnects the first and third segments 401 and 403, the third segment 403 interconnects the second and fourth segments 402 and 404.

Each segment includes a portion of the insulation layer 41, a portion of the upper copper foil 42, and a portion of the bottom copper foil 43. In the illustrated embodiment, the first segment 401 includes a first foil portion 421 and a second foil portion 431, the second segment 402 includes a third foil portion 422 and a fourth foil portion 432, the third segment 403 includes a fifth foil portion 423 and a sixth foil portion 433, the fourth segment 404 includes a seventh foil portion 424 and an eighth foil portion 434. The first, third, fifth, and seventh foil portions 421 through 424 are portions of the upper copper foil 42. The second, fourth, sixth, and eighth foil portions 431 through 434 are portions of the bottom copper foil 43.

Figure 26:
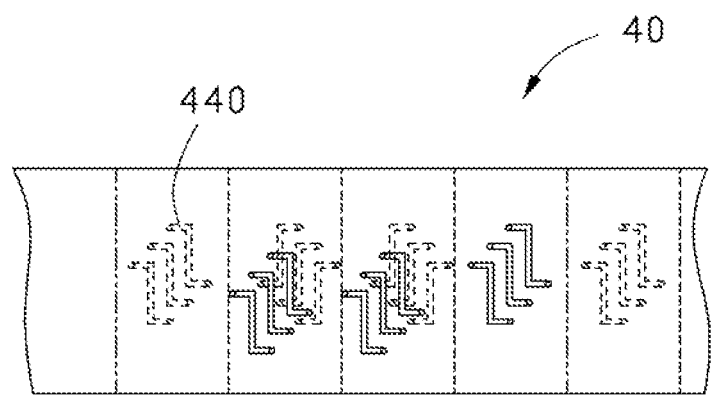
FIG. 26 is similar to FIG. 24, but shows six foil portions of the strip formed into traces.
Figure 27:
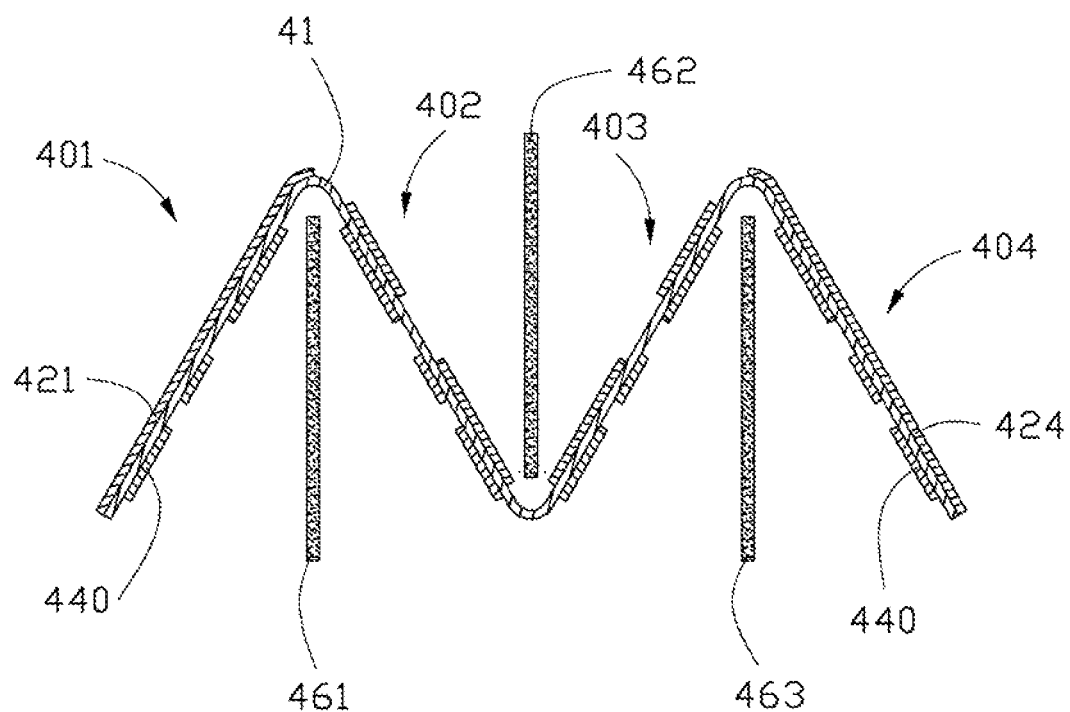
FIG. 27 is a schematic view of folding one PCB unit separated from the strip of FIG. 26.

Referring to FIGS. 26 and 27, in step (2), the strip 40 is treated in a reel to reel process to form the second, third, fourth, fifth, sixth, and eighth foil portions 431, 422, 432, 423, 433, and 434 into traces 440. The first and seventh foil portions 421 and 424 are left untreated without traces 440. The traces 440 can be obtained by etching the upper and bottom copper foils 42 and 43 of the strip 40.

Referring to FIG. 27, in step (3), the strip 40 is cut along border lines between each two adjacent PCB units 400 to obtain separate PCB units 400.

Referring to FIG. 27, in step (4), each of the separate PCB units 400 is folded along border lines between each two adjacent segments in such a manner that the second segment 402 is positioned between the first and third segments 401 and 403, and the third segment 403 is positioned between the second and fourth segments 402 and 404. In particular, the traces 440 formed from the second foil portion 431 are adjacent to the traces 440 formed from the fourth foil portion 432, the traces 440 formed from the third foil portion 422 are adjacent to the traces 440 formed from the fifth foil portion 423, and the traces 440 formed from the sixth foil portion 433 are adjacent to the traces formed from the eighth foil portion 434.

Figure 28:
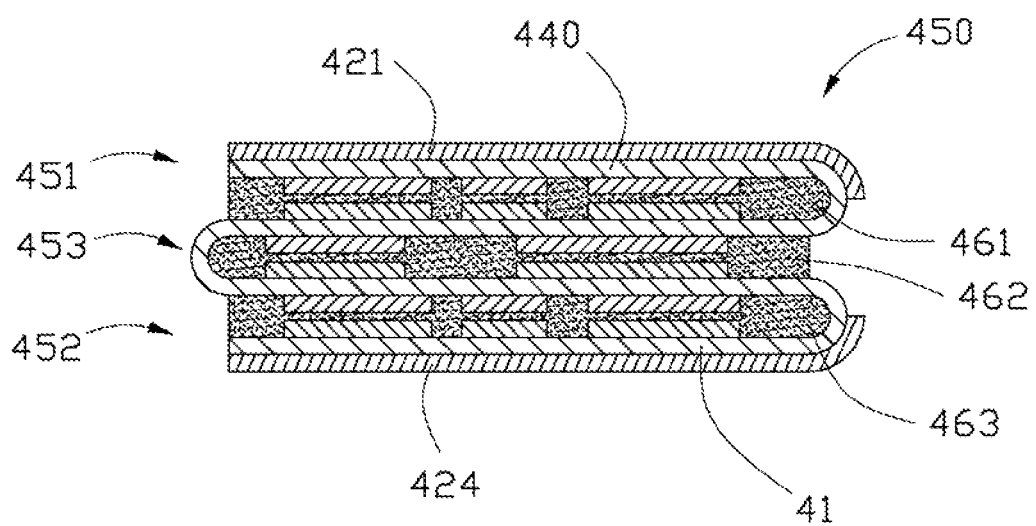
FIG. 28 is a schematic view of laminating the folded PCB unit of FIG. 27.

Referring to FIGS. 27 and 28, in step (5), a first adhesive sheet 461 is disposed between the first and second segments 401 and 402, a second adhesive sheet 462 is disposed between the second and third segments 402 and 403, a third adhesive sheet 463 is disposed between the third and fourth segments 403 and 404. Then the folded PCB unit 400 and the adhesive sheets 461 through 463 are laminated together to form an eight-layer substrate 450.

The eight-layer substrate 450 includes a first outer substrate 451, a second outer substrate 452, and an inner substrate 453 sandwiched between the first and second outer substrates 451 and 452. The first outer substrate 451 consists of the insulation layer 41 of the first segment 401 and the first foil portion 421. The second outer substrate 452 consists of the insulation layer 41 of the fourth segment 404 and the seventh foil portion 424. The inner substrate 453 consists of the traces 440 formed from the second foil portion 431, the first adhesive sheet 461, the traces 440 formed from the fourth foil portion 432, the insulation layer 41 of the second segment 402, the traces 440 formed from the third foil portion 422, the second adhesive sheet 462, the traces 440 formed from the fifth foil portion 423, the insulation layer 41 of the third segment 403, the traces 440 of formed from the sixth foil portion 433, the third adhesive sheet 463, and the traces 440 formed from the eighth foil portion 434. That is, both of the first and second outer substrates 451 and 452 are single-layer substrates, and the inner substrate 453 is a six-layer substrate. Both of the first and seventh foil portions 421 and 424 are exposed to the exterior.

Figure 29:
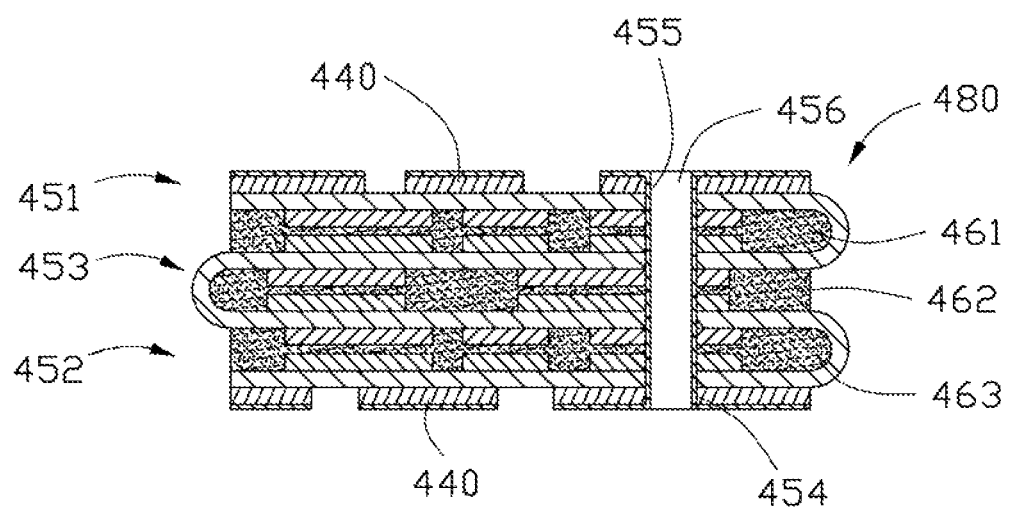
FIG. 29 is a schematic view of an obtained eight-layer PCB.

Referring to FIGS. 28 and 29, in step (6), the eight-layer substrate 450 is manufactured to be an eight-layer PCB 480. Both of the first and seventh foil portions 421 and 427 are formed into traces 440, in a panel process. The traces 440 of the substrates 451 through 453 can be electrically connected with each other by via holes.

In the illustrated embodiment, the method of manufacturing the eight-layer PCB 480 from the eight-layer substrate 450 includes the following steps. First, a through hole 454 is formed in the eight-layer substrate 450. Then the eight-layer substrate 450 is processed using an electroless plating technology and electroplating technology to form a coating 455 on the sidewall of the through hole 454, on the surface of the first foil portion 421, and on the surface of the seventh foil portion 424. Thus, a plated through hole 456 is obtained to electrically connect the traces 440 of the inner substrate 453, the first foil portion 421 of the first outer substrate 451, and the seventh foil portion 424 of the second outer substrate 452 together. Finally, traces 440 are formed at the first and second outer substrates 451 and 452 by etching the first and seventh foil portions 421 and 424.

In the above-mentioned steps, it is understood that each of the eight foil portions of the PCB unit 400 is processed to form one circuit layer of the eight-layer PCB 480, and the circuit layers of the four-layer PCB 480 are electrically connected with each other by the plated through hole 456.

In the above-mentioned methods, the circuit layers of the inner substrates 153, 253, 353, and 453 of a number of multilayer PCBs 180, 280, 380, and 480 can be formed simultaneously with the same accuracy using reel to reel process technology. As such, the efficiency of manufacture a number of multilayer PCBs 180, 280, 380, and 480 is improved and the quality and functioning are reliable.

It is noted that nine-layer PCBs, ten-layer PCBs, or any other multilayer PCBs can be manufactured by the method of the present disclosure, using steps similar to the above-mentioned steps.

It should be emphasized that the described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

The invention claimed is:

1. A method for manufacturing multilayer flexible PCBs, each of the flexible PCBs comprising n circuit layers, n representing an even integer greater than 2, the method comprising the following steps, in the order listed:

first, providing a flexible substrate strip wound around two spools, the flexible substrate strip comprising two copper foils and an insulating layer sandwiched between the two copper foils, the flexible substrate strip including a plurality of PCB units connected sequentially along a length direction of the flexible substrate strip, each PCB unit comprising n/2 segments connected along a length direction of the PCB unit, each segment including two copper foil portions;

second, forming n−2 copper foil portions of each PCB unit into traces with remaining two copper foil portions of each PCB unit left untreated, in a reel to reel process;

third, cutting the flexible substrate strip into pieces along border lines between the PCB units to separate the PCB units from each other;

fourth, folding each PCB unit along border lines between the n/2 segments in such a manner that the traces formed from the n−2 copper foil portions are folded and sandwiched between the remaining untreated two copper foil portions;

fifth, laminating each folded PCB unit to form a plurality of laminated multilayer substrates; and sixth, forming traces in the remaining untreated two copper foil portions.

2. The method of claim 1, wherein the step of forming the n−2 copper foil portions of each PCB unit into traces with remaining two copper foil portions of each PCB unit left untreated, comprises:

unwinding the flexible substrate strip from one spool;

treating the unwound portion between the two spools such that the n−2 copper foil portions of each PCB unit are formed into the traces; and feeding and winding the treated unwound portion onto the other spool.

3. The method of claim 2, wherein the copper foils are etched in the step of treating the unwound portion.

4. The method of claim 1, wherein the n/2 segments have a same size.

5. The method of claim 4, wherein the border lines between the n/2 segments are substantially parallel to each other and substantially perpendicular to the length of the flexible substrate strip, and the n segments are folded along the border lines therebetween.

6. The method of claim 1, wherein the border lines between the PCB units are substantially parallel to each other and substantially perpendicular to a length of the flexible substrate strip.

7. The method of claim 1, wherein each of the segments are folded in a manner such that the segments are substantially parallel with each other.

8. The method of claim 1, wherein after the step of folding each PCB unit and before the step of laminating each folded PCB unit, (n−2)/2 adhesive sheets are provided and each adhesive sheet is sandwiched between two adjacent segments.

9. The method of claim 1, wherein after the step of forming traces in the remaining untreated two copper foil portions, two coverlays are formed over the traces of the remaining two foil portions, respectively.

10. A method for manufacturing multilayer flexible PCBs, each of the flexible PCBs comprising n circuit layers, n representing an odd integer greater than 2, the method comprising the following steps, in the order listed:
   first, providing a flexible substrate strip wound around two spools, the flexible substrate strip comprising two copper foils and an insulating layer sandwiched between the two copper foils, the flexible substrate strip including a plurality of PCB units connected sequentially along a length direction of the flexible substrate strip, each PCB unit comprising (n+1)/2 segments connected along a length direction of the PCB unit, each segment including two copper foil portions;
   second, treating each PCB unit to remove one foil portion and to form n−2 copper foil portions into traces with remaining two copper foil portions of each PCB unit left untreated, in a reel to reel process;
   third, cutting the flexible substrate strip into pieces along border lines between the PCB units to separate the PCB units from each other;
   fourth, folding each PCB unit along border lines between the (n+1)/2 segments in such a manner that the traces formed from the n−2 copper foil portions are folded and sandwiched between the remaining untreated two copper foil portions;
   fifth, laminating each folded PCB unit to form a plurality of laminated multilayer substrates; and
   sixth, forming traces in the remaining untreated two copper foil portions.

11. The method of claim 10, wherein the step of treating each PCB unit to remove one foil portion and to form n−2 copper foil portions into traces with remaining two copper foil portions of each PCB unit left untreated comprises:
   unwinding the flexible substrate strip from one spool;
   treating the unwound portion between the two spools such that the n−2 copper foil portions of each PCB unit are formed into the traces; and
   feeding and winding the treated unwound portion onto the other spool.

12. The method of claim 11, wherein the copper foils are etched in the step of treating the unwound portion.

13. The method of claim 10, wherein the (n+1)/2 segments have a same size.

14. The method of claim 13, wherein the border lines between the (n+1)/2 segments are substantially parallel to each other and substantially perpendicular to the length of the flexible substrate strip, and the n segments are folded along the border lines therebetween.

15. The method of claim 10, wherein the border lines between the PCB units are substantially parallel to each other and substantially perpendicular to a length of the flexible substrate strip.

16. The method of claim 10, wherein each of the segments are folded in a manner such that the segments are substantially parallel with each other.

17. The method of claim 10, wherein after the step of folding each PCB unit and before the step of laminating each folded PCB unit, (n−1)/2 adhesive sheets are provided and each adhesive sheet is sandwiched between two adjacent segments.

18. The method of claim 10, wherein after the step of forming traces in the remaining untreated two copper foil portions, two coverlays are formed over the traces of the remaining two segments, respectively.

* * * * *